(12) United States Patent
Tanaka et al.

(10) Patent No.: US 7,804,108 B2
(45) Date of Patent: Sep. 28, 2010

(54) SEMICONDUCTOR DEVICES

(75) Inventors: Hiroaki Tanaka, Toyota (JP); Sachiko Kawaji, Aichi-ken (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 733 days.

(21) Appl. No.: 11/632,315

(22) PCT Filed: Jun. 3, 2005

(86) PCT No.: PCT/JP2005/010623

§ 371 (c)(1),
(2), (4) Date: Jan. 12, 2007

(87) PCT Pub. No.: WO2006/008888

PCT Pub. Date: Jan. 26, 2006

(65) Prior Publication Data

US 2008/0067542 A1 Mar. 20, 2008

(30) Foreign Application Priority Data

Jul. 16, 2004 (JP) ............................. 2004-209715

(51) Int. Cl.
*H01L 29/43* (2006.01)
*H01L 29/76* (2006.01)
(52) U.S. Cl. ...................................... 257/139; 257/330
(58) Field of Classification Search ................. 257/133, 257/139, 330, 331, 332, E21.585, E29.027, 257/E29.198, E29.201
See application file for complete search history.

(56) References Cited

U.S. PATENT DOCUMENTS 5,329,142 A 7/1994 Kitagawa 5,448,083 A 9/1995 Kitagawa (Continued)

FOREIGN PATENT DOCUMENTS

EP 0 889 531 1/1999

(Continued)

OTHER PUBLICATIONS

International Search Report.

(Continued)

*Primary Examiner*—Hung Vu
(74) *Attorney, Agent, or Firm*—Finnegan, Henderson, Farabow, Garrett & Dunner, LLP

(57) ABSTRACT

The semiconductor device has a collector electrode, a $p^+$ collector region formed on the collector electrode, an $n^-$ drift region formed on the collector region, a $p^-$ body region formed on the drift region, and a plurality of $n^+$ emitter regions formed within the body region. The emitter regions are connected to an emitter electrode. A plurality of trench gate electrodes is formed within the body region. Each trench gate electrode opposes, via an insulating layer, a portion of the body region separating the drift region and the emitter region. The body region is divided into a plurality of body sections, and the body sections are classified into two groups. One group has the emitter region within the body section, and the other group has no emitter region within the body section. A plurality of first trenches is formed within the body section having no emitter region. A $p^+$ contact region is formed between the first trench and the trench gate electrode.

8 Claims, 9 Drawing Sheets

U.S. PATENT DOCUMENTS

| | | | |
|---|---|---|---|
| 5,585,651 | A | 12/1996 | Kitagawa |
| 5,689,121 | A | 11/1997 | Kitagawa et al. |
| 5,838,026 | A | 11/1998 | Kitagawa |
| 6,111,290 | A | 8/2000 | Uenishi et al. |
| 6,737,705 | B2 | 5/2004 | Momota |
| 7,616,859 | B2 * | 11/2009 | Tokura et al. ............... 385/147 |
| 7,619,280 | B2 * | 11/2009 | Cao et al. .................... 257/330 |
| 7,629,644 | B2 * | 12/2009 | Onda et al. .................. 257/330 |
| 2001/0054738 | A1 | 12/2001 | Momota |
| 2004/0084722 | A1 | 5/2004 | Yamaguchi |

FOREIGN PATENT DOCUMENTS

| | | |
|---|---|---|
| EP | 1 032 047 A2 | 8/2000 |
| EP | 1 271 654 | 1/2003 |
| EP | 1 376 704 | 1/2004 |
| JP | 2002-100770 | 4/2002 |

OTHER PUBLICATIONS

Written Opinion of the ISA.

Office Action from German Patent Office dated Nov. 13, 2008 (3 pages).

* cited by examiner

SEMICONDUCTOR DEVICES

The present application claims priority to Japanese Patent Application 2004-209715 filed on Jul. 16, 2004, the contents of which are hereby incorporated by reference.

TECHNICAL FIELD

The present invention relates to semiconductor devices which perform bipolar operations such as IGBT (Insulated Gate Bipolar Transistor). The present invention relates to a technology for overcoming a trade-off between on-voltage (or on-resistance) and breakdown-voltage of the semiconductor devices. The on-voltage in this description means a voltage difference between a collector and an emitter of the semiconductor device while the semiconductor device is turned-on. The breakdown-voltage in this description means a maximum voltage applicable between the collector and the emitter while the semiconductor device is turned-off for the semiconductor device to maintain a normal condition. In designing semiconductor devices, in general, when on-voltage is decreased, breakdown-voltage is also decreased, and when breakdown-voltage is increased, on-voltage is also increased. There is the trade-off between on-voltage and breakdown-voltage of the semiconductor devices, and it was not possible to realize semiconductor devices having low on-voltage and high breakdown-voltage. The present invention relates to semiconductor devices that have overcome this trade-off, and realized low on-voltage and high breakdown-voltage.

BACKGROUND ART

Vigorous research is being performed on semiconductor devices that perform bipolar operations. This includes research on an IGBT in which low on-voltage is obtained by means of conductivity modulation.

Generally, in this type of semiconductor devices, there is a tradeoff such that a decrease in on-voltage of the semiconductor devices is accompanied by a decrease in breakdown-voltage of the semiconductor devices. Research is being performed to overcome this tradeoff, so that high breakdown-voltage can be maintained even when on-voltage is reduced.

One such example is set forth in Japanese Laid-Open Patent Publication No. 2001-308327. FIG. 8 schematically shows a longitudinal sectional view of essential parts of a semiconductor device set forth in Japanese Laid-Open Patent Publication No. 2001-308327. It should be noted that the configuration of the longitudinal sectional view shown in FIG. 8 is repeated in the left-right direction of the page.

In FIG. 8, a semiconductor device 300 comprises a collector electrode C, a $p^+$ type collector region 322 connected to the collector electrode C, an $n^-$ type drift region 324 connected to the collector region 322, and a $p^-$ type body region 326 separated from the collector region 322 by the drift region 324. The semiconductor device 300 further comprises a plurality of $n^+$ type emitter regions 328 separated from the drift region 324 by the body region 326. An emitter electrode E is connected to the emitter regions 328. A plurality of trench gate electrodes 332 is formed within the body region 326. Each trench gate electrode 332 opposes, via a gate insulating layer 334, a portion of the body region 326 that is separating the drift region 324 and the emitter region 328. Two trench gate electrodes 332 are shown on each of left-right sides in FIG. 8. The body region 326 is divided into a plurality of body sections by the plurality of trench gate electrodes 332. The body sections are classified into two groups. The body section 326a of one group has the emitter region 328 within the body section (shown on each of left-right sides in FIG. 8), and the body section 326b of the other group has no emitter region 328 within the body section (shown in a central portion of FIG. 8). A plurality of trenches 335 is formed within the body section 326b having no emitter region 328. Each trench 335 is made of a conductor 338 covered with a trench insulating layer 336. The conductors 338 of the trenches 335 are connected to the emitter electrode E. An inter layer insulating layer 339 covers a top surface of the body sections 326b having no emitter region 328. The body sections 326b having no emitter region 328 are isolated from the emitter electrode E by the inter layer insulating layer 339.

The body sections 326b having the trenches 335 are termed positive hole accumulation regions 312. The emitter regions 328 are formed repeatedly, with a determined pitch, outside the positive hole accumulation regions 312. The positive hole accumulation regions 312 are formed by locally failing to form the emitter regions 328. The positive hole accumulation regions 312 are distributed with a constant spacing within the semiconductor device.

FIG. 9 is a top-plane view of essential parts along the line IX-IX of FIG. 8. FIG. 9 shows a border between the positive hole accumulation regions 312 and a peripheral region 314. The peripheral region 314 forms a loop around a region in which switching elements are formed. The switching elements are formed from the plurality of emitter regions 328, the trench gate electrodes 332, and trenches 335, etc. The peripheral region 314 maintains breakdown-voltage by means of having a depletion layer extend from the region having switching elements towards a periphery. An FLR (Field Limiting Ring) structure or guard ring structure (not shown), or the like, is formed in the peripheral region 314.

As shown in FIG. 9, the trench gate electrodes 332 (in FIG. 9, the gate insulating layer 334 covering the trench gate electrodes 332 are shown), and the trenches 335 (in FIG. 9, the trench insulating layers 336 covering the conductors 338 are shown) extend in a y direction and are repeated in an x direction, forming a striped shape. Further, the emitter regions 328 and $p^+$ type body contact regions 325 are formed alternately in the y direction between the trench gate electrodes 332. The emitter regions 328 and the body contact regions 325 are connected to the emitter electrode E. The semiconductor device 300 is turned-on when a voltage more positive than the emitter electrode E is applied to the collector electrode C and when a voltage more positive than the emitter electrode E is applied to the trench gate electrodes 332.

A characteristic feature of the semiconductor device 300 is that the body sections 326b within the positive hole accumulation regions 312 are not connected with the emitter electrode E. As a result, positive holes injected from the collector region 322 to the drift region 324 are prevented from passing through the body sections 326b within the positive hole accumulation regions 312 and are prevented from being discharged to the emitter electrode E. Consequently, many of the positive holes accumulate within the body sections 326b in the positive hole accumulation regions 312. The concentration of positive holes within the semiconductor device 300 thus increases, and conductivity modulation is activated. The on-voltage of the semiconductor device 300 is thus reduced. Further, the potential of the trenches 335 is fixed to the emitter potential, and consequently the effect of accumulating the positive holes is greater.

Moreover, the trenches 335 have the advantages described below when the semiconductor device 300 is turned-off. For the sake of comparison, a positive hole accumulation region 312 without the trenches 335 will be considered. In this case, an electrical field will readily be concentrated in a vicinity region 329 (see FIG. 8) of the bottom of the trench gate electrodes 332 at both ends of the positive hole accumulation region 312. This concentration of the electrical field reduces the breakdown-voltage of the semiconductor device 300. In particular, the above problem becomes serious as the width of the positive hole accumulation regions 312 increases. However, if the trenches 335 are formed in the positive hole accumulation region 312, the concentration of the electrical field is reduced, and the destruction of the semiconductor device 300 can be prevented. In particular, there is a greater need to provide the trenches 335, as the width of the positive hole accumulation regions 312 increases.

DISCLOSURE OF INVENTION

As shown in FIG. 9, a $p^+$ type peripheral body contact region 327 is formed at the border between the region having switching elements and the peripheral region 314. The peripheral body contact region 327 extends along the inner border of the peripheral region 314, forming a loop around the region having switching elements. The role of the peripheral body contact region 327 is to discharge, to the emitter electrode E, the positive holes injected to the body region 326 in the peripheral region 314.

In researching the causes of destruction of this type of semiconductor device 300, the present inventors ascertained the following phenomenon.

When the semiconductor device 300 is turned-off, the trenches 335 that are formed in a striped shape physically obstruct the positive holes accumulated in the body sections 326b in the positive hole accumulation regions 312 from flowing in the x direction. Consequently, as shown in FIG. 9, the positive holes that have accumulated flow along a longitudinal direction of the trenches 335 (the y direction). The positive holes that are flowing along the longitudinal direction are discharged to the emitter electrode E via the peripheral body contact region 327. As described above, positive holes also flow into the peripheral body contact region 327 from the peripheral region 314. Consequently, there is an excess concentration of positive holes in the peripheral body contact region 327. The present inventors ascertained that this type of semiconductor device is destroyed by the excess concentration of positive holes in the peripheral body contact region 327. In summary, the positive hole accumulation regions 312 are provided in the semiconductor device so that a large number of positive holes are accumulated and on-voltage is thus reduced. However, there is an excess concentration of positive holes when these positive holes are to be discharged, and this reduces breakdown-voltage of the semiconductor device. There is thus a trade-off such that a reduction in on-voltage leads to a decrease in the breakdown-voltage of the semiconductor device.

The present invention presents semiconductor devices in which the above phenomenon is taken into account and in which, on the basis of this new knowledge, the excess concentration of positive holes is prevented. The present invention aims to overcome the tradeoff between on-voltage and breakdown-voltage.

One of the preferred semiconductor devices according to the invention comprises a collector electrode, a collector region having a first conductivity type and connected to the collector electrode, a drift region having a second conductivity type and connected to the collector region, a body region having the first conductivity type and separated from the collector region by the drift region, and a plurality of emitter regions. Each emitter region has the second conductivity type and is separated from the drift region by the body region. An emitter electrode is connected to the emitter regions. The semiconductor device further comprises a plurality of trench gate electrodes. Each trench gate electrode opposes, via a gate insulating layer, a portion of the body region separating the drift region and the emitter region. The body region is divided into a plurality of body sections by the plurality of trench gate electrodes. The body sections are classified into two groups. The body section of one group has the emitter region within the body section, and the body section of the other group has no emitter region within the body section. Furthermore, the semiconductor device comprises a plurality of first trenches formed within the body section having no emitter region. A peripheral region is formed so as to surround the emitter regions and the trench gate electrodes. The semiconductor device of the invention has a contact region having the first conductivity type. Each contact region is formed between the first trench and the trench gate electrode, and is connected to the emitter electrode. A portion of the body section located between the plurality of first trenches is electrically connected to the emitter electrode via the contact region.

The portion of the body region between the plurality of first trenches is not directly connected with the emitter electrode. The portion of the body region between the plurality of first trenches is connected via the contact region with the emitter electrode.

The first trenches may pass through the body region and extend to the drift region, or may remain within the body region.

A pair of the trench gate electrodes divides the body section into two groups of having no emitter regions and having emitter regions. The plurality of first trenches is formed at the inner side between the pair of trench gate electrodes. The first trenches are classified into two groups. The first trenches of the first group are next to the pair of the trench gate electrodes. The first trenches of the second group are located between other first trenches. The first trenches next to the trench gate electrode are termed outer first trenches, and the first trenches interposed between other first trenches are termed inner first trenches.

The contact region is formed within the body section located between the trench gate electrode and the outer first trench. The body section having no emitter regions interposed between the pair of the trench gate electrodes has a portion between the trench gate electrode and the outer first trench at both sides of the body section having no emitter regions. The contact region may be formed at either one side or both sides of the body section having no emitter regions. The contact region is not formed within the body section between the first trenches.

The contact region must be provided within the body section having no emitter regions interposed between the pair of the trench gate electrodes. Therefore, the configuration in which a contact region forms a loop around the region having switching elements, as with the peripheral body contact region 327 in FIG. 9 of the conventional structure does not meet the requirement of the contact region of this invention. The contact region of the present invention and the peripheral body contact region in the prior art is completely different.

Providing the body sections having no emitter regions promotes accumulation of carriers of the first conductive type in these body sections. The on-voltage of the semiconductor device can consequently be reduced. Providing the first trenches within the body sections having no emitter regions prevents the electrical field from concentrating in a vicinity of the bottom of the trench gate electrodes while the semiconductor device is turned-off.

When the semiconductor device is tuned-off, at least a portion of the carriers accumulated in the body sections having no emitter regions is discharged to the emitter electrode via the contact region formed in this body section. Providing the contact region makes it possible to prevent carriers of the first conductive type from concentrating in the discharge route.

It might be understood that the accumulation of the carriers of the first conductive type might be less effective if a portion of the body section, whose aim is to accumulate the carriers of the first conductive type, is connected with the emitter electrode via the contact region. However, the contact region of the present invention is formed at the outermost part of the body sections having the first trenches. It is consequently easy to increase the distance between the contact region and the body sections having no emitter regions, in which the carriers of the first conductive type are accumulated. As a result, while the semiconductor device is turned-on, the carriers of the first conductive type are not discharged immediately from the body sections having no emitter regions to the contact regions. Suitable adjustment of the shape of the first trenches, and suitable adjustment of the shape of the area of the contact regions, etc. can be used to effectively accumulate the carriers of the first conductive type in the body sections having no emitter regions while the semiconductor device is turned-on. When the semiconductor device is turned-off, the carriers of the first conductive type are not discharged immediately from the body sections having no emitter regions to the contact regions. This phenomenon effectively prevents concentration of the carriers of the first conductive type in the discharge route when the semiconductor device is turned-off. By this means, it is possible to overcome the tradeoff and realize the low on-voltage and high breakdown-voltage.

It may be preferred that the first trenches are made of an insulator or of a conductor covered with an insulator.

In the present specification, the insulator or the insulating layer has a broader meaning that includes a dielectric substance. The conductor within the first trenches may be electrically connected with the emitter electrode, or may not be connected. Here, 'conductor' includes a semiconductor into which a high concentration of impurities has been introduced.

It is preferred that each of the first trenches extends longitudinally and at least one slit is formed in each of the first trenches so that there is electrical conduction, by means of the slits, between the body sections separated by each of the first trenches. In this case, the each body section between the first trenches is electrically connected with the adjacent body section via the slit, and is finally connected with the emitter electrode via the contact region.

It is preferred that the location of the slit in the longitudinal direction along the first trench mutually differs in adjacent first trenches. Accordingly, the carriers of the first conductive type accumulated in the body sections between the first trenches pass in a winding manner through the slits, and are finally discharged to the emitter electrode via the contact region. Consequently, it is possible to prevent the carriers of the first conductive type from being discharged immediately while the semiconductor device is turned-on, and the carriers of the first conductive type can thus accumulate effectively. It is possible to overcome the tradeoff that when on-voltage of the semiconductor device decreases, its breakdown-voltage also decreases.

It is preferred that each of the trench gate electrodes extends longitudinally, and each of the first trenches has elements extending in parallel with the trench gate electrode and elements extending orthogonally with the trench gate electrode. One of the first trenches may have elements extending in two directions. Two or more of the first trenches may have mutually differing directional elements.

Accordingly, the first trenches divide the body region having no emitter regions into a plurality of body sections in a complex pattern. Consequently, the carriers of the first conductive type accumulated in the body sections having no emitter regions must flow a comparatively longer discharge route. By this means, a greater number of carriers of the first conductive type accumulate, and a semiconductor device can be obtained in which on-voltage is greatly reduced.

It is preferred that each of the trench gate electrodes extends longitudinally, and each of the first trenches extends in a direction orthogonal to the longitudinal direction of the trench gate electrodes.

Accordingly, the body section between the first trenches is continuous in a direction of joining adjacent trench gate electrodes. Consequently, the carriers of the first conductive type move along the direction, and are then discharged to the emitter electrode via the contact region. The carriers of the first conductive type can be prevented from concentrating in the discharge route, and a semiconductor device with a high breakdown-voltage can be obtained.

It is preferred that each of the trench gate electrodes extends longitudinally, and a plurality of first trenches is repeated along the longitudinal direction of the trench gate electrode. That is, a unit structure of the first trench is repeated in the longitudinal direction of the trench gate electrodes.

In this case, the discharge route of the carriers of the first conductive type is repeated in the longitudinal direction of the trench gate electrodes. The discharge route of the carriers of the first conductive type is thus more dispersed, and consequently it is possible to prevent excess concentration of the carriers of the first conductive type. As a result, a semiconductor device with a high breakdown-voltage can be obtained.

The other semiconductor device according to the invention comprises a second trench formed along an inner boundary of the peripheral region. This second trench may be used instead of the contact regions, or may be used together with the contact regions.

In the aforementioned semiconductor device, the second trench is formed at the boundary between the peripheral region and the body section having the first trenches. Providing the second trench makes it possible to reduce the concentration of carriers of the first conductive type.

It may be preferred that the second trench is made of an insulator, a conductor, or a conductor covered with an insulator.

In the case where the insulator or the conductor covered with an insulator is located within the second trench, it is possible to physically prevent concentration of the carriers at the same location. That is, the carriers moving from the body sections with the first trenches, and the carriers moving from the peripheral region does not merge. In the case where the conductor is located within the second trench, there is a rapid discharge to the emitter electrode, via the conductor, of the carriers of the first conductive type moving from the body sections with the first trenches, and of the carriers of the first conductive type moving from the peripheral region. The conductor is capable of discharging a large number of carriers. In either of the cases, the excess concentration of carriers of the first conductive type is alleviated, and it is possible to obtain a semiconductor device with a high breakdown-voltage.

Further, it is preferred that either one of, or both of, a body sections and a peripheral region that are formed on both sides of the second trench are connected with the emitter electrode.

The carriers of the first conductive type moving to either of these locations can reliably be discharged to the emitter electrode via differing routes.

It may be preferred that the conductor provided within the first trenches and/or the second trenches are connected to the emitter electrode.

When the conductor of the first trench is connected to the emitter electrode, the carriers of the first conductive type can accumulate uniformly in the body sections having the first trenches. The quantity of accumulation increases, and a semiconductor device with a low on-voltage and high breakdown-voltage can be obtained.

When the conductor of the second trench is connected to the emitter electrode, the carriers of the first conductive type are discharged rapidly to the emitter electrode via the second trench. Consequently a semiconductor device with a high breakdown-voltage can be obtained.

In the case where the conductor of the second trench is covered by an insulator, it is preferred that the conductor is connected to the emitter electrode. In this case, the carriers of the first conductive type can be attracted along a wide range of a side wall of the second trench. Consequently, the excess concentration of carriers of the first conductive type is alleviated, and a semiconductor device with a high breakdown-voltage can be obtained.

According to the present invention, it is possible to overcome the tradeoff in the semiconductor device whereby a decrease in on-voltage leads to a decrease in breakdown-voltage. The present invention can realize the semiconductor devices having superior on-voltage (low on-voltage) and superior breakdown voltage (high breakdown-voltage).

BEST MODE FOR CARRYING OUT THE INVENTION

Embodiments will be described with reference to the figures. Semiconductor devices described below use silicon as a semiconducting material. However, other semiconducting material, or a combination of semiconducting materials, may be used in place of silicon.

First Embodiment

Figure 1:
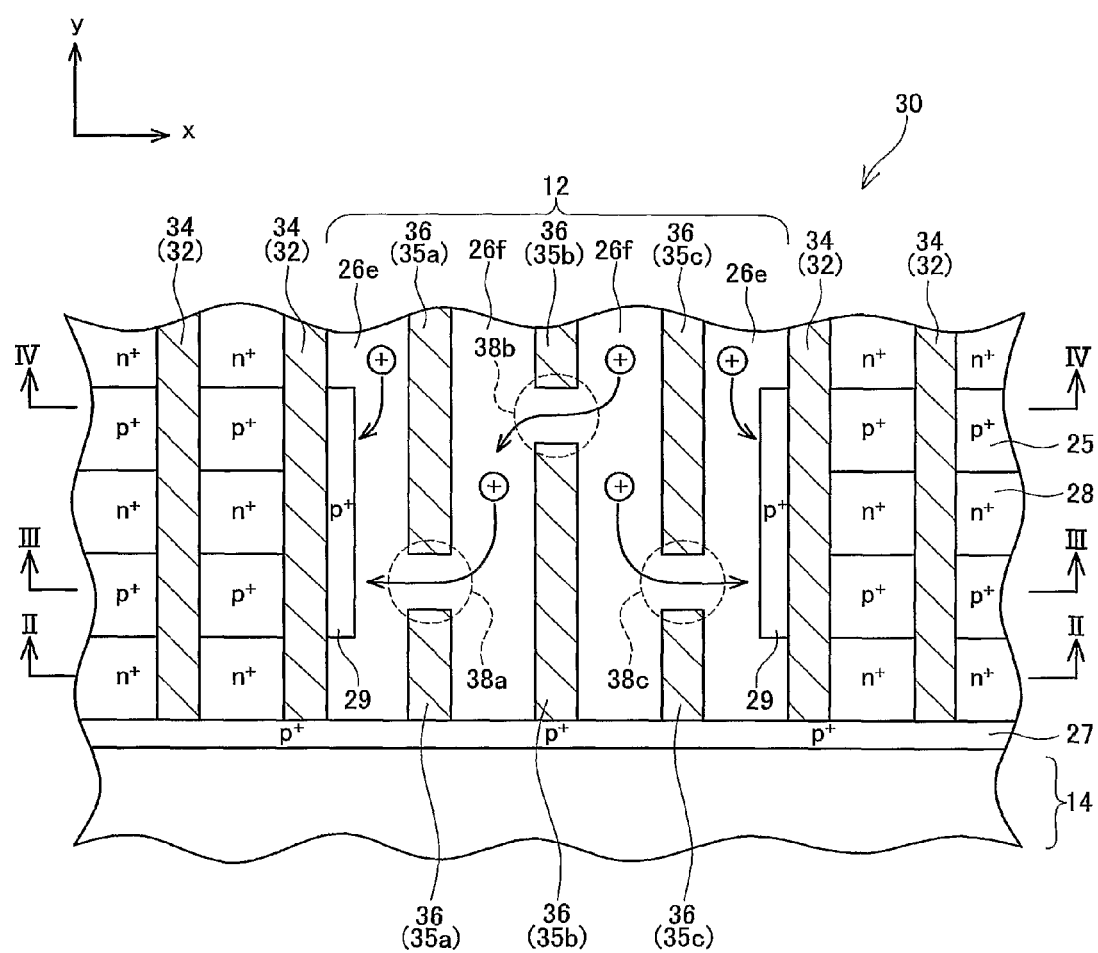
FIG. 1 shows a top plane view of essential parts of a first embodiment in which some of covering layers are removed.

FIG. 1 shows a top plane view of essential parts of a semiconductor device 30 of a first embodiment. Some of the covering layers are removed in FIG. 1. The top plane view shows a border between positive hole accumulation region 12 and a peripheral region 14. An FLR (Field Limiting Ring) structure or guard ring structure (not shown), or the like, is formed in the peripheral region 14.

Figure 2:
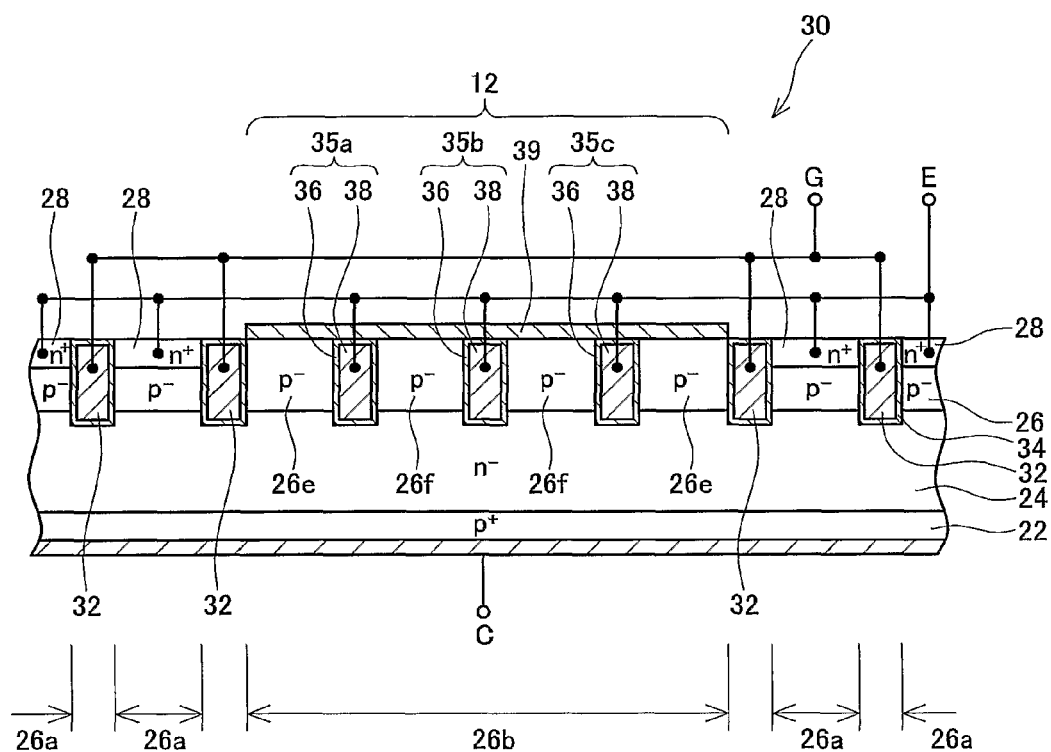
FIG. 2 shows a longitudinal sectional view along the line II-II of FIG. 1.
Figure 3:
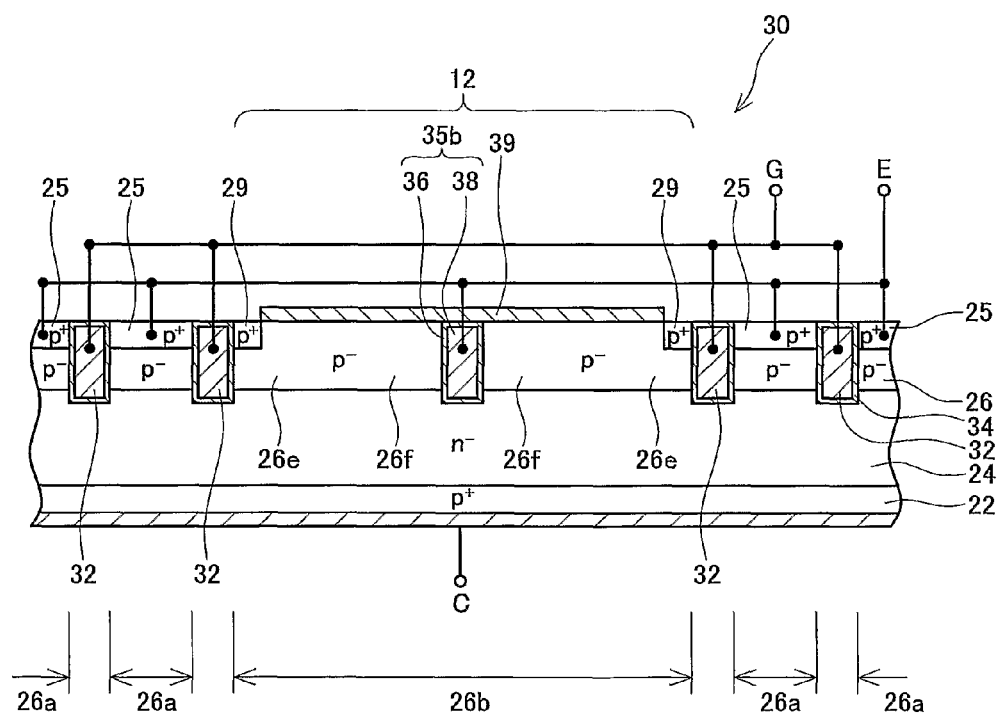
FIG. 3 shows a longitudinal sectional view along the line III-III of FIG. 1.
Figure 4:
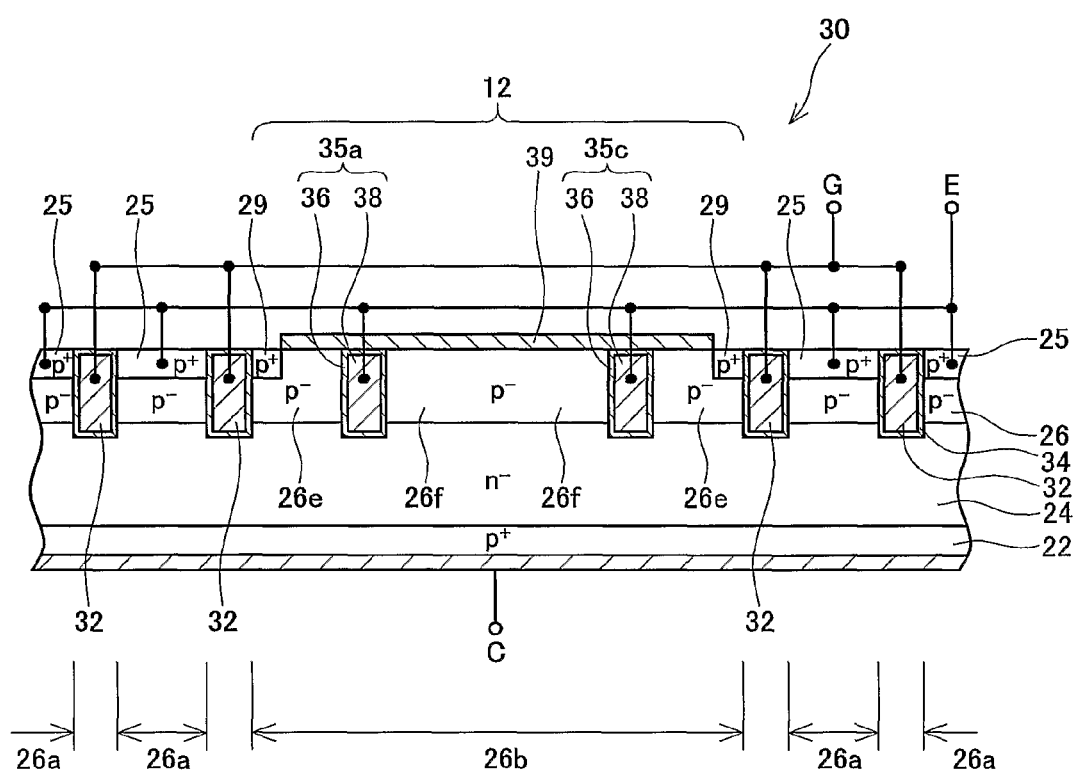
FIG. 4 shows a longitudinal sectional view along the line IV-IV of FIG. 1.

Further, a longitudinal sectional view of essential parts of this semiconductor device is shown in FIG. 2, FIG. 3, and FIG. 4. FIG. 2 is a longitudinal sectional view along the line II-II of FIG. 1. FIG. 3 is a longitudinal sectional view along the line III-III of FIG. 1. FIG. 4 is a longitudinal sectional view along the line IV-IV of FIG. 1.

As shown in FIGS. 2, 3, and 4, the semiconductor device 30 of the preferred embodiment comprises a collector electrode C made of aluminum at a bottom face. A $p^+$ type collector region 22 is formed on the collector electrode C. The collector region 22 can be formed so as to cover an entire face of the collector electrode C, or can be dispersed on the collector electrode C. An $n^-$ type drift region 24 is formed on the collector region 22. A $p^-$ type body region 26 is formed on the drift region 24. The body region 26 is separated from the collector region 22 by the drift region 24. A plurality of $n^+$ type emitter regions 28 is formed within the body region 26. The emitter regions 28 are separated from the drift region 24 by the body region 26. An emitter electrode E is connected to the emitter regions 28. An $n^+$ type semiconducting region may be formed between the collector region 22 and the drift region 24.

A plurality of trench gate electrodes 32 is formed within the body region 26 (in FIG. 1, gate insulating layers 34 covering the trench gate electrodes 32 are shown). Each trench gate electrode 32 opposes, via the gate insulating layer 34, a portion of the body region 26 separating the drift region 24 and the emitter region 28. Two trench gate electrodes 32 are shown on each side in FIGS. 1, 2, 3, and 4. As shown in FIG. 1, the trench gate electrodes 32 extend in a y direction and are repeated in an x direction, forming a so-called striped shape. The emitter regions 28 and $p^+$ type body contact regions 25 are repeated alternately in the y direction between the trench gate electrodes 32 shown in the left-right sides of the page. The emitter regions 28 and the body contact regions 25 are connected to the emitter electrode E.

The body region 26 is divided into a plurality of body sections. Each body section is isolated from the other body sections. The body sections are classified into two groups. One group (26a) has the emitter region 28 within the body section 26a, and the other group (26b) has no emitter region 28 within the body section 26b.

A plurality of first trenches 35a, 35b, 35c is formed within the body section 26b having no emitter region 28. The first trenches 35a, 35b, 35c penetrate the body section 26 and extend to the drift region 24 (in FIG. 1, trench insulators 36 comprising a part of the first trenches 35a, 35b, 35c are shown). The first trenches 35a, 35b, 35c are made of a conductor 38 covered with the trench insulating layer 36. The conductor 38 of the first trench 35a, 35b, 35c is made of poly-silicon. The conductor 38 of the first trench 35a, 35b, 35c is connected with the emitter electrode E. With the exception of a limited area (to be described), a top surface of the body sections 26b having no emitter region 28 is covered by an inter layer insulating layer 39.

As shown in FIG. 1, a clearance (a slit) 38a is formed in a first trench 35a, a clearance (a slit) 38b is formed in a first trench 35b, and a clearance (a slit) 38c is formed in a first trench 35c. The clearances 38a, 38b, and 38c are formed in differing locations along the y direction. That is, the clearances 38a, 38b, and 38c are not formed along a straight line between adjoining trench gate electrodes 32 (i.e. in the x direction). The sections 26b of the body region 26 having the first trenches 35a, 35b, 35c is termed a positive hole accumulation region 12. The positive hole accumulation regions 12 are repeated at a constant spacing within the semiconductor device. One could also say that the positive hole accumulation regions 12 are formed at a constant rate in the semiconductor device.

A p$^+$ type contact region 29 is formed between the outermost first trench 35a, 35c and the trench gate electrode 32. The p$^+$ type contact region 29 is selectively (locally) formed within the positive hole accumulation region 12, that is, between the trench gate electrode 32 and the adjacent first trench (i.e. the outermost first trench, in this case the first trenches shown as 35a and 35c). These body sections are shown as body sections 26e so that they can be distinguished from the other body sections 26. A contact region 29 is formed near each of the clearances 38a and 38c. The inter layer insulating layer 39 is not formed above the contact region 29. The contact region 29 is connected to the emitter electrode E. The body section 26f between the first trenches 35a and 35b is connected with the contact region 29 via the slit 38a. The body section 26f between the first trenches 35b and 35c is connected with the contact region 29 via the slits 38a and 38b, and is connected with the other contact region 29 via the slit 38c. The body section 26f between the first trenches 35a and 35b is also connected with the other contact region 29 via the slits 38b and 38c.

The positive hole accumulation region 12 shown in FIG. 1 is repeated in the y direction. That is, clearances (slits) 38 separated by constant spaces along the y direction are repeated, in the y direction. The corresponding contact regions 29 are also repeated in the y direction.

Further, a peripheral body contact region 27 is formed at a border between the region having the trench gate electrodes 32 (a region having switching elements) and the peripheral region 14. The peripheral body contact region 27 extends along the inner border of the peripheral region 14, forming a loop around the region having switching elements. The peripheral body contact region 27 has the role of discharging, to the emitter electrode E, positive holes injected from the collector region 22 at the peripheral region 14 to the body region at the peripheral region 14.

Figure 9:
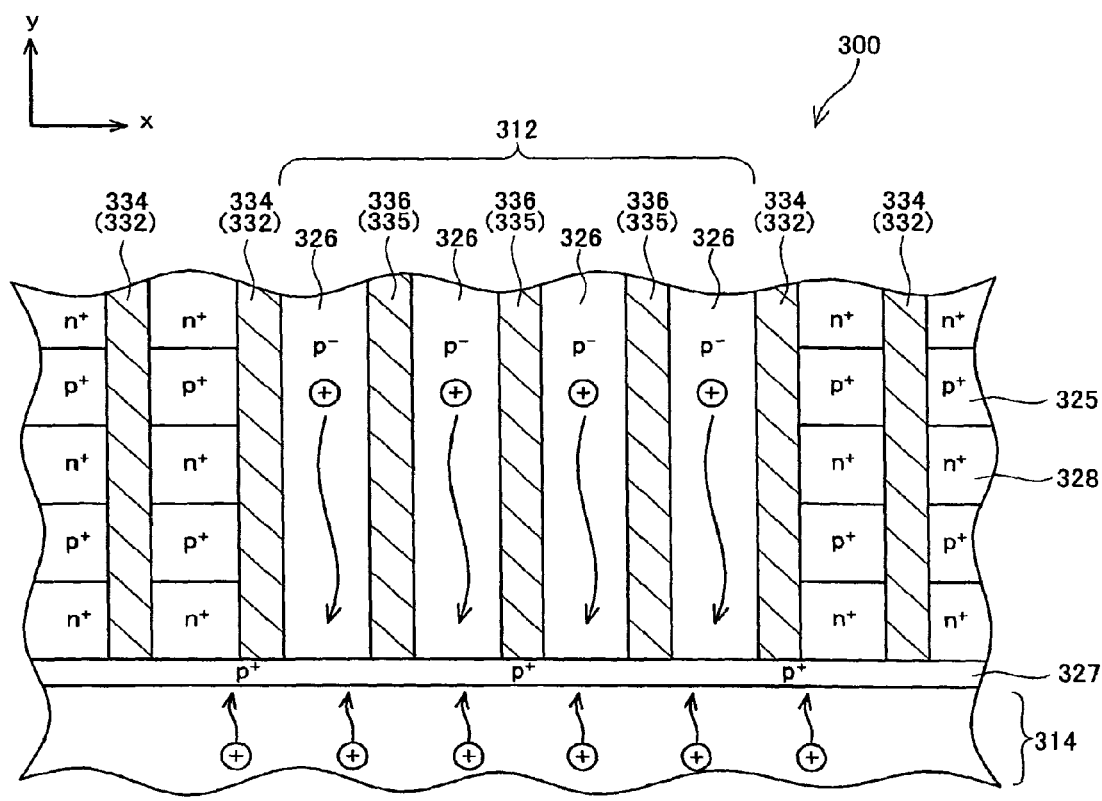
FIG. 9 shows a top plane view of essential parts of the conventional semiconductor device.

FIG. 1 shows the movement of the positive holes when the semiconductor device has been turned-off. When compared with the conventional configuration in FIG. 9, the characteristics of the present embodiment are clearly apparent.

As shown in FIG. 1, when the semiconductor device is turned-off, the positive holes accumulated in the body sections 26f between the first trench 35a and the first trench 35c move through the clearances (slits) 38a, 38b, and 38c to the contact regions 29. Thereupon, the positive holes are discharged to the emitter electrode E via the contact regions 29. Although not shown, some of the positive holes accumulated in the body sections 26e, 26f are discharged to the emitter electrode E via the peripheral body contact region 27. However, since the discharge route via the contact region 29 is provided, the number of positive holes discharged to the emitter electrode E via the peripheral body contact region 27 is drastically reduced relative to the conventional configuration in FIG. 9. As a result, it is possible to prevent the situation in which an excess of positive holes are concentrated in the peripheral body contact region 27.

In the semiconductor device of the present embodiment, the clearances 38 and the contact region 29 are repeated in the y direction in the positive hole accumulation regions 12. Consequently, the positive holes accumulated in the positive hole accumulation regions 12 move so as to be distributed in each of the contact regions 29. The discharge route of the positive holes is distributed, and this alleviates the excess concentration of positive holes. It is thus possible to obtain a semiconductor device which has a high breakdown-voltage.

The aforementioned semiconductor device also has the following characteristics. The contact regions 29 are formed at inner sides of the pair of gate electrodes 32 which are located at both ends of the positive hole accumulation region 12, and which divide the body sections 26b having no emitter region 28 from the body sections 26a having the emitter region 28. Consequently, there is a long distance between the contact regions 29 and the inner side (a central part) of the positive hole accumulation region 12 in which the positive holes accumulate. This reduces the rapid discharge of the positive holes while the semiconductor device is turned-on. A greater number of positive holes accumulate, and the on-voltage of the semiconductor device is thus reduced.

Further, the clearances 38 are not formed along a straight line extending between the pair of trench gate electrodes 32. Consequently, the positive holes accumulated in the positive hole accumulation region 12 move in a winding manner as they pass through the clearances 38 towards the contact regions 29. The distance to the contact regions 29 is thus increased. This reduces the rapid discharge of the positive holes while the semiconductor device is turned-on, and consequently the on-voltage of the semiconductor device is reduced.

Moreover, in the present embodiment, the first trenches 35 have a configuration essentially identical with the trench gate electrodes 32. Consequently, they can be manufactured using an identical process. The first trenches 35 can be made in a simple manner merely by adjusting the patterning of a masking material for forming the clearances 38. There is consequently no need of adding a new process specific for forming the first trenches 35, and simple manufacturing is thus possible.

Figure 5:
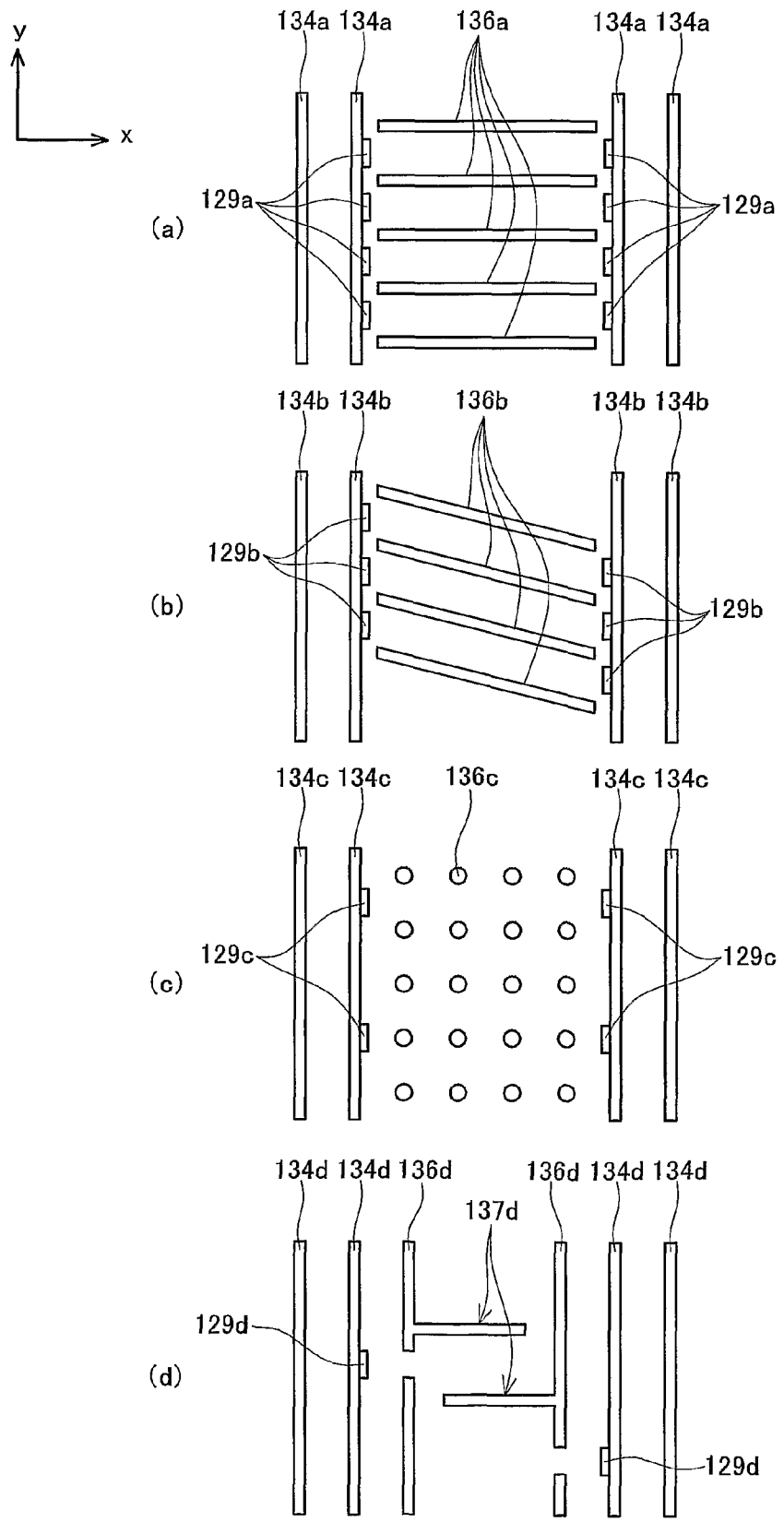
FIG. 5(a) to (d) show top plane views of essential parts of variants of the first embodiment.

FIG. 5 schematically shows variants of the first embodiment. 134a, 134b, 134c, and 134d are a plurality of trench gate electrodes formed in a striped shape. Regions between the trench gate electrodes 134 are positive hole accumulation regions. First trenches with a variety of differing shapes may be formed in the positive hole accumulation regions. Positive holes accumulated in any of the positive hole accumulation regions can be prevented from concentrating excessively in the peripheral body contact regions (not shown, but extending in the x and y directions in these cases).

In FIG. 5(a), first trenches 136a are formed in a striped shape and extend in a direction linking adjacent trench gate electrodes 134a (the x direction). That is, the first trenches 136a extend in a direction orthogonal to the trench gate electrodes 134. In this case, when the semiconductor device is turned-off, the positive holes accumulated between the first trenches 136a move along the longitudinal direction of the first trenches 136a (the x direction). The positive holes that have moved are discharged to the emitter electrode via contact regions 129a formed at both sides of the positive hole accumulation region. Consequently, the positive holes can be prevented from concentrating excessively in peripheral body contact regions (not shown).

In FIG. 5(b), first trenches 136b are formed in a striped shape and extend in a direction that has elements of the direction linking adjacent trench gate electrodes 134b (the x direction) and elements of the direction orthogonal to this direction (the y direction). This could also be termed a direction that is inclined with respect to the x direction.

In this case, when the semiconductor device is turned-off, the positive holes accumulated between the first trenches 136b move in the inclined direction. The positive holes that have moved are discharged to the emitter electrode via contact regions 129b formed at both sides of the positive hole accumulation region. Consequently, the positive holes can be prevented from concentrating excessively in peripheral body contact regions (not shown).

In FIG. 5(c), first trenches 136c are dot shaped. In this case, the accumulated positive holes pass through spaces between the dots to move towards contact regions 129c formed at both sides of the positive hole accumulation region. The positive holes are prevented from concentrating excessively in peripheral body contact regions (not shown).

In FIG. 5(d), first trenches are formed as first trenches 136d that extend in the y direction, and as first trenches 137d that extend in the x direction. Spaces between the first trenches 136d and the first trenches 137d join with body sections at both sides.

In this case, as well, the positive holes accumulated between the first trenches 136d and the first trenches 137d are discharged to the emitter electrode via contact regions 129d formed in the body sections at both sides of the positive hole accumulation region. Consequently, the positive holes can be prevented from concentrating excessively in peripheral body contact regions (not shown). In this case, moreover, body sections of the positive hole accumulation region are arranged in a complex manner. Consequently, the positive holes accumulated between the first trenches 136d and the first trenches 137d move in a winding manner as they pass towards the contact regions 129d. The distance to the contact regions 129d is thus increased. This increases the number of positive holes accumulated in the body section of the positive hole accumulation region while the semiconductor device is turned-on, and consequently a low on-voltage can be obtained.

In this example, the first trenches 136d and the first trenches 137d are joined. However, they may equally well be separate. Further, the first trenches are not limited to being formed only in the x and y directions, but may be formed so as to have a mixture of any other directional elements.

Second Embodiment

Figure 6:
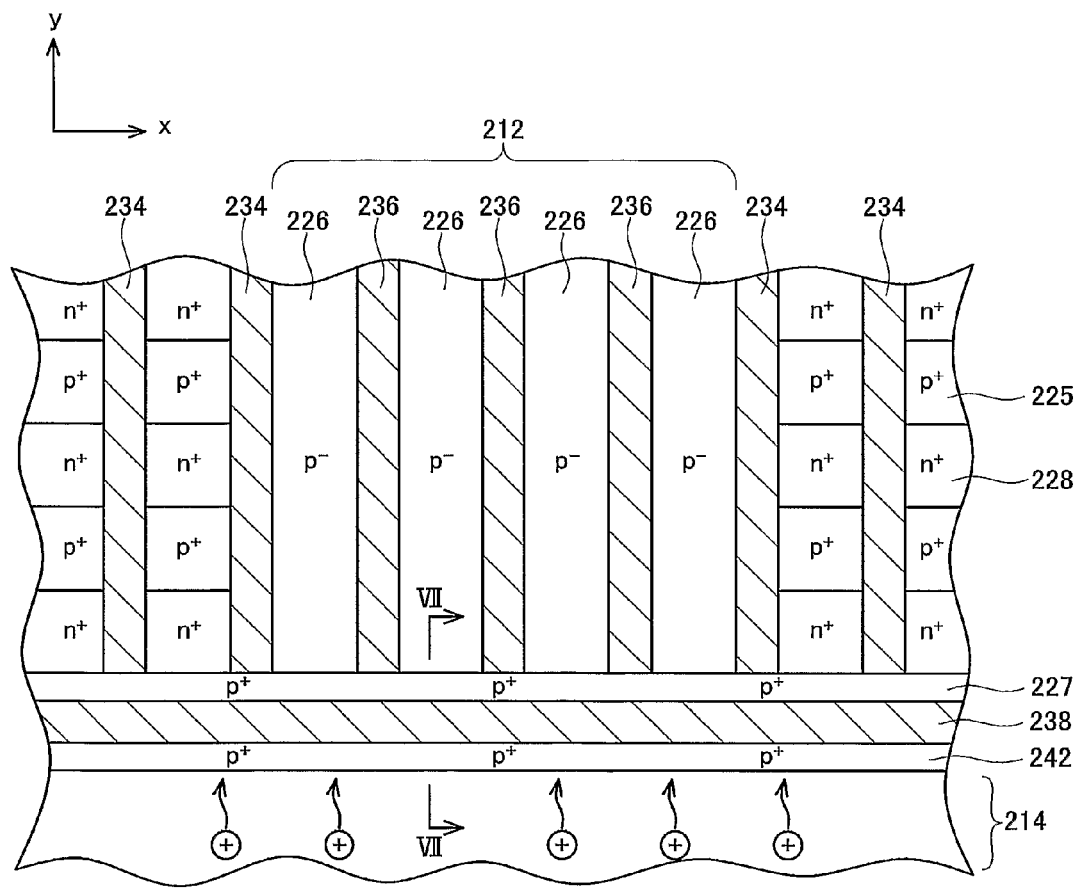
FIG. 6 shows a top plane view of essential parts of a second embodiment.

FIG. 6 shows a top plane view of essential parts of a semiconductor device of a second embodiment. A longitudinal sectional view of essential parts of this semiconductor device is identical with the conventional configuration and the first embodiment. Consequently, a description thereof is omitted.

A characteristic feature of this semiconductor device is that a second trench 238 is provided that separates a peripheral region 214 and a body sections 226 having a plurality of first trenches (in FIG. 6, trench insulating layers 236 are shown instead of the first trenches). The second trench 238 is made of an insulator. Further, peripheral side contact regions 227 and 242 that are connected to an emitter electrode are formed at the peripheral region 214 side and a positive hole accumulation region 212 side. The second trench 238 is located between these peripheral side contact regions 227 and 242.

Figure 7:
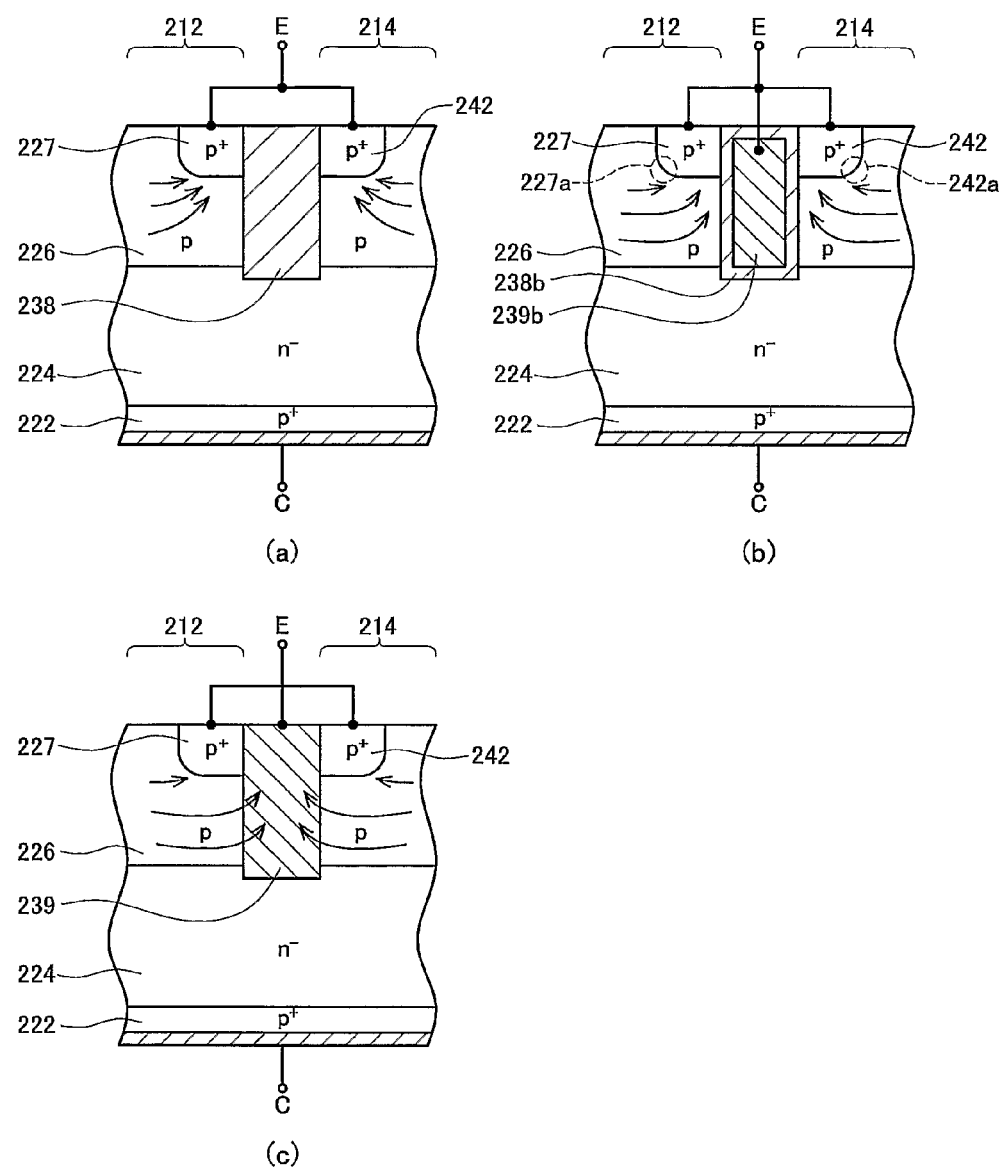
FIG. 7(a) shows a longitudinal sectional view along the line VII-VII of FIG. 6.
FIG. 7(b) and FIG. 7(c) show longitudinal sections of variants of the second embodiment.
Figure 8:
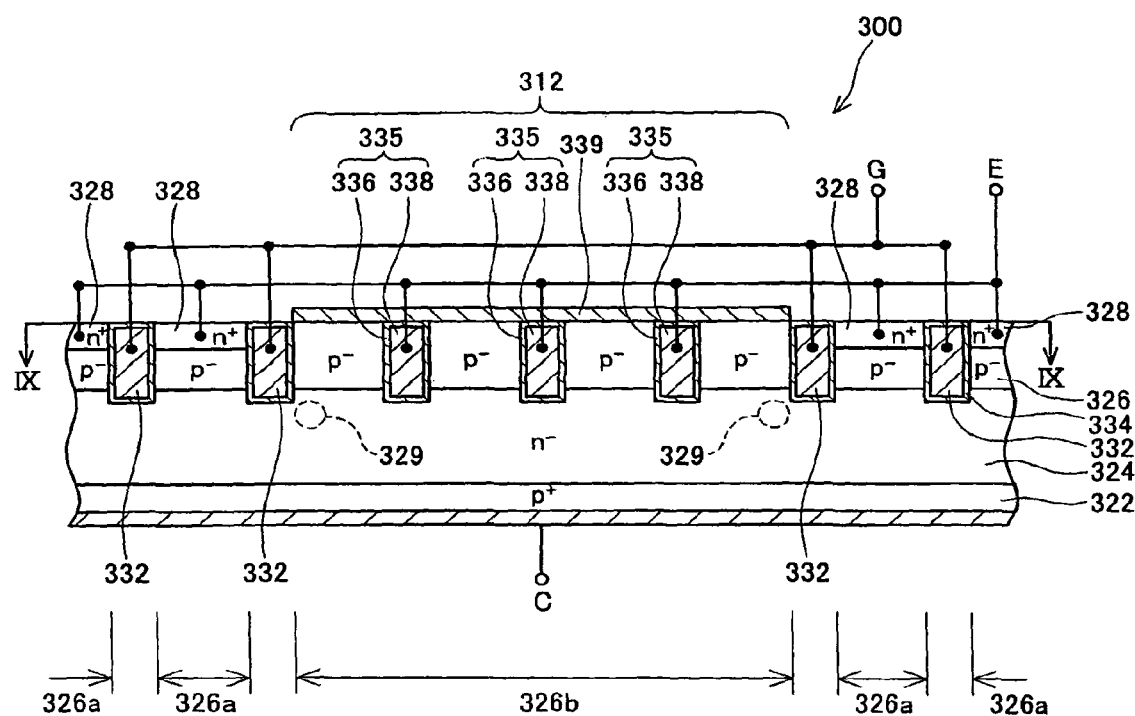
FIG. 8 shows a longitudinal sectional view of essential parts of a conventional semiconductor device.

FIG. 7(a) shows a longitudinal sectional view of essential parts along the line VII-VII of FIG. 6. The arrows in FIG. 7(a) show the movement of positive holes. As shown in FIG. 7(a), providing the second trench 238 physically obstructs the movement of the positive holes injected from the positive hole accumulation region 212 side and the peripheral region 214 side. Consequently, the concentration of positive holes is prevented. Further, since the peripheral side contact regions 227 and 242 are provided for each region, positive holes injected from each region are discharged to the emitter electrode via these peripheral side contact regions 227 and 242. The concentration of positive holes can thus be prevented reliably, and high breakdown-voltage of the semiconductor device can be obtained.

The concentration of positive holes can be prevented even more effectively by combining the technology of the first embodiment and the second embodiment, and a semiconductor device with even greater breakdown-voltage can be obtained.

FIGS. 7(b) and (c) show variants of the second embodiment. In the variant in FIG. 7(b), a conductor 239b (made, for example, of poly-silicon) is covered by an insulating layer 238b (made, for example, of silicon oxide). These replace the second trench 238 of the second embodiment. The conductor 239b is connected with an emitter electrode E.

In this variant, a portion of the positive holes that have moved from the positive hole accumulation region 212 side and the peripheral region 214 side are attracted to the conductor 239b that is fixed to the emitter potential. Consequently, these positive holes are discharged to the emitter electrode E that extends along a side wall of the insulating layer 238b. If the second trench is filled with insulator, the positive holes that have moved from the positive hole accumulation region 212 side and the peripheral region 214 side readily concentrate at portions of the peripheral side contact regions 227 and 242 that have a high degree of curvature (227a and 242a). When the second trench is filled with the conductor 239b covered by the insulator 238b, the positive holes are attracted to the conductor 239b that is fixed to the emitter potential.

Therefore, in the present variant, excess concentration of positive holes at the portions (227a and 242a) having a high degree of curvature can be reduced. Since the concentration of positive holes can be prevented effectively, a semiconductor device with greater breakdown-voltage can be obtained.

In the variant in FIG. 7(c), a conductor 239 (made, for example, of a metal such as aluminum) fills the second trench 238 of the second embodiment. The conductor 239 is connected with an emitter electrode E.

In this variant, a portion of the positive holes that have moved from the positive hole accumulation region 212 side and the peripheral region 214 side are rapidly discharged to the emitter electrode E via the conductor 239. Consequently, excess concentration of positive holes can be reduced at the parts of the peripheral side contact regions 227 and 242 that have a high degree of curvature. Since the concentration of positive holes can be prevented effectively, a semiconductor device with greater breakdown-voltage can be obtained.

The embodiments described above merely illustrate some possibilities of the invention and do not restrict the claims thereof. The art set forth in the claims encompasses various transformations and modifications to the embodiments described above.

Furthermore, the technical elements disclosed in the present specification or figures may be utilized separately or in all types of conjunctions and are not limited to the conjunctions set forth in the claims at the time of submission of the application. Furthermore, the art disclosed in the present specification or figures may be utilized to simultaneously realize a plurality of aims or to realize one of these aims.

The invention claimed is:

1. A semiconductor device comprising:
a collector electrode;
a collector region having a first conductivity type and connected to the collector electrode;

a drift region having a second conductivity type and connected to the collector region;

a body region having the first conductivity type and separated from the collector region by the drift region;

a plurality of emitter regions, each emitter region having the second conductivity type and being separated from the drift region by the body region;

an emitter electrode connected to the emitter regions;

a plurality of trench gate electrodes, each trench gate electrode opposing, via an insulating layer, a portion of the body region separating the drift region and the emitter region, the body region being divided into a plurality of body sections by the plurality of trench gate electrodes, and the body sections being classified into two groups, wherein one group has the emitter region within the body section, and the other group has no emitter region within the body section;

a plurality of first trenches formed within each of the body sections having no emitter region;

a peripheral body contact region having the first conductivity type and surrounding the emitter regions and the trench gate electrodes, a peripheral region surrounding the peripheral body contact region; and a contact region having the first conductivity type, being formed between the trench gate electrode and the first trench adjacent to the trench gate electrode, not being formed between the first trenches, and being connected to the emitter electrode;

wherein a portion of the body section located between the first trenches is electrically connected to the emitter electrode via the contact region.

2. The semiconductor device according to claim 1, wherein the first trenches are made of an insulator or of a conductor covered with an insulator.

3. The semiconductor device according 2, wherein the conductor provided within the first trenches are connected to the emitter electrode.

4. The semiconductor device according to claim 1, wherein each of the first trenches extends longitudinally, a slit is formed in each of the first trenches, and there is electrical conduction, by means of the slits, between the body sections located at both sides of the first trench.

5. The semiconductor device according to claim 4, wherein the locations of the slits in adjacent first trenches mutually differ, in a longitudinal direction of the first trench.

6. The semiconductor device according to claim 1, wherein each of the trench gate electrodes extends longitudinally, and each of the first trenches extends in a direction that has elements of the longitudinal direction of the trench gate electrodes and the direction orthogonal thereto.

7. The semiconductor device according to claim 1, wherein each of the trench gate electrodes extends longitudinally, and each of the first trenches also extends, wherein a longitudinal direction of the first trenches is orthogonal to the longitudinal direction of the trench gate electrodes.

8. The semiconductor device according to claim 1, wherein each of the trench gate electrodes extends longitudinally, and the plurality of first trenches is repeated in the longitudinal direction of the trench gate electrodes.

* * * * *